United States Patent
Hara et al.

(10) Patent No.: US 9,626,631 B2
(45) Date of Patent: Apr. 18, 2017

(54) ANALYSIS DEVICE, ANALYSIS METHOD, AND PROGRAM

(71) Applicant: International Business Machines Corporation, Armonk, NY (US)

(72) Inventors: Satoshi Hara, Tokyo (JP); Tetsuro Morimura, Tokyo (JP); Raymond H. Rudy, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 14/729,357

(22) Filed: Jun. 3, 2015

(65) Prior Publication Data
US 2015/0371150 A1    Dec. 24, 2015

(30) Foreign Application Priority Data

Jun. 20, 2014  (JP) ................................ 2014-127217

(51) Int. Cl.
| | | |
|---|---|---|
| *G06F 15/18* | (2006.01) | |
| *G06N 99/00* | (2010.01) | |
| *G06F 17/50* | (2006.01) | |

(52) U.S. Cl.
CPC ....... *G06N 99/005* (2013.01); *G06F 17/5095* (2013.01)

(58) Field of Classification Search
None
See application file for complete search history.

(56) References Cited

U.S. PATENT DOCUMENTS

| | | | | |
|---|---|---|---|---|
| 2009/0213133 | A1* | 8/2009 | Kawamura | ....... G06F 17/30994 345/589 |
| 2009/0276193 | A1* | 11/2009 | Momose | ................. G06F 17/50 703/1 |
| 2012/0136640 | A1* | 5/2012 | Ito | ..................... G01M 17/0078 703/8 |

FOREIGN PATENT DOCUMENTS

| | | | | |
|---|---|---|---|---|
| JP | 2001051977 | A | * | 2/2001 |
| JP | 2008117381 | A | * | 5/2008 |
| JP | EP 2017755 | A1 | * | 1/2009 ............. G06F 17/50 |
| JP | 2009199325 | A | | 9/2009 |
| JP | 2012123782 | A | | 6/2012 |
| JP | 5159368 | B2 | | 3/2013 |
| WO | 2007122677 | A1 | | 11/2007 |
| WO | 2011016499 | A1 | | 2/2011 |

OTHER PUBLICATIONS

Yamada et al., "High-Dimensional Feature Selection by Feature-Wise Kernalized Lasso", Aug. 22, 2013, Yahoo! Labs, Sunnyvale, CA., pp. 1-18.

Translation of Pending JP Application No. 2014-127217, filed Jun. 20, 2014, entitled, "Analysis Device, Analysis Method, and Program", (46 pages).

* cited by examiner

*Primary Examiner* — Luis Sitiriche
(74) *Attorney, Agent, or Firm* — Scott S. Dobson

(57) ABSTRACT

An analysis device which analyzes a system that inputs input data including a plurality of input parameters and outputs output data, including an acquisition unit that acquires learning data including a plurality of sets of the input data and the output data, and a learning processing unit that learns, based on the acquired learning data, the amount of difference of output data corresponding to a difference between input parameters of two pieces of input data, an (Continued)

analysis method using the analysis device, and a program used in the analysis device are provided.

18 Claims, 9 Drawing Sheets

FIG. 2
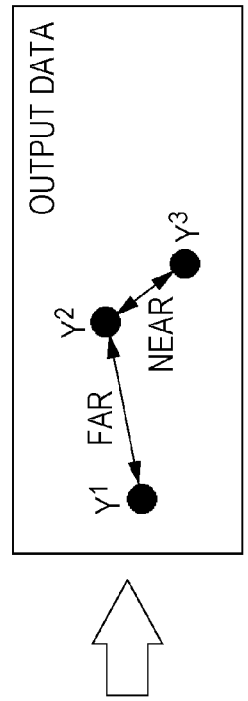
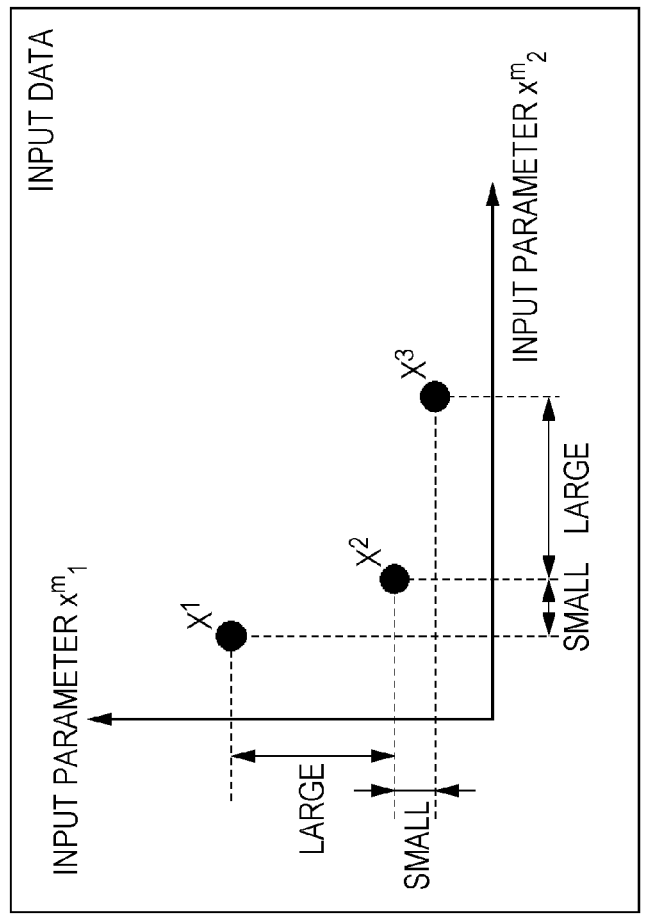

ANALYSIS DEVICE, ANALYSIS METHOD, AND PROGRAM

BACKGROUND

Technical Field

The present invention relates to an analysis device, an analysis method, and a program.

Background Art

Conventionally, a method for analyzing a system which inputs structured input data including a plurality of input parameters and outputs output data relative to the input data and for specifying, among the input parameters, a parameter which greatly affects output data, has been known (for example, see M. Yamada, et al. High-Dimensional Feature Selection by Feature-Wise Kernelized Lasso. Neural Computation, vol. 26, no. 1, pp. 185-207, 2014).

However, conventionally, it has not been possible to predict the degree of change of output data according to the amount of change of each input parameter of the system, and it has been difficult to estimate suitable input parameters based on prediction results. For example, in a system or problem which sets input data including a large number of input parameters as initial conditions and/or constraints of a model and obtains output data to be evaluated by a complex actual test or simulation, much time and/or a large amount of processing are required to obtain output data of the system.

SUMMARY OF INVENTION

According to a first aspect of the present invention, an analysis device for analyzing a system that inputs input data including a plurality of input parameters and outputs output data is provided. The analysis device includes an acquisition unit that acquires learning data including a plurality of sets of the input data and the output data, and a learning processing unit that learns, based on the acquired learning data, an amount of difference of output data corresponding to a difference between input parameters of two pieces of input data.

According to another aspect of the present invention, an analysis method for analyzing a system that inputs input data including a plurality of input parameters and outputs output data is provided. The method includes: an acquisition step of acquiring learning data including a plurality of sets of the input data and the output data; and a learning processing step of learning, based on the acquired learning data, an amount of difference of output data corresponding to a difference between input parameters of two pieces of input data.

According to another aspect of the present invention, a computer program product for analyzing a system that inputs input data including a plurality of input parameters and outputs output data is provided. The computer program product includes: at least one computer readable non-transitory storage medium having computer readable program instructions thereon for execution by a processor, the computer readable program instructions comprising program instructions for: acquiring learning data including a plurality of sets of the input data and the output data; and learning, based on the acquired learning data, an amount of difference of output data corresponding to a difference between input parameters of two pieces of input data.

BRIEF DESCRIPTION OF DRAWINGS

FIG. 2 illustrates the relationship between the difference of input parameters and the amount of difference of output data of the system.

DESCRIPTION OF EMBODIMENTS

Hereinafter, the present invention will be described through embodiments. However, the embodiments described below are not intended to limit the invention according to the scope of the claims. Furthermore, all the combinations of the features described in the embodiments are not necessarily essential to the solution to the present invention. Moreover, sub-combinations of the features may also be included in the present invention.

Figure 1:
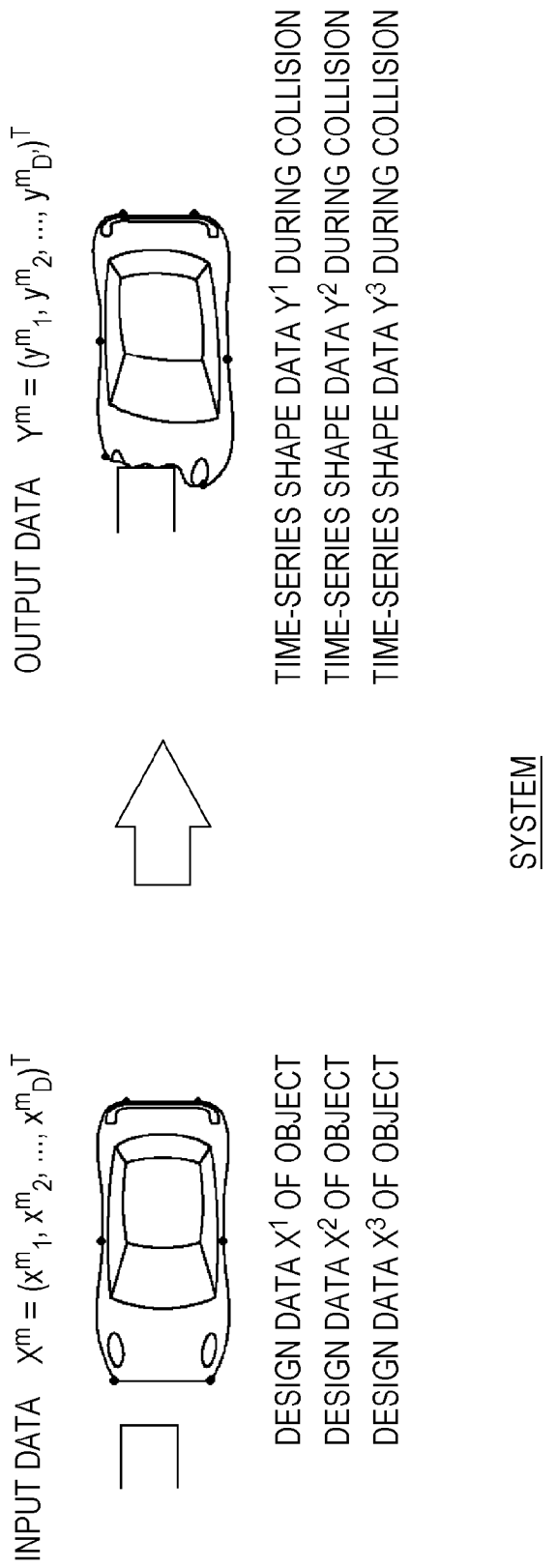
FIG. 1 schematically illustrates an example of a system to be analyzed by an analysis device according to an embodiment.

FIG. 1 schematically illustrates an example of a system to be analyzed by an analysis device according to an embodiment. The system inputs a plurality of pieces of input data $X^m$ (for example, $X^1, X^2, X^3, \ldots,$ and $X^m$) which include a plurality of input parameters (for example, D input parameters $x^m_1, x^m_2, \ldots,$ and $x^m_D$) and outputs a plurality of pieces of output data $Y^m$ (for example, $Y^1, Y^2, Y^3, \ldots,$ and $Y^m$) which include a plurality of output parameters (for example, D' output parameters $y^m_1, y^m_2, \ldots,$ and $y^m_{D'}$) which correspond to the input data $X^m$.

For example, the system is a simulation system such as a collision simulation. For example, the system inputs initial conditions in a collision simulation as input parameters (for example, design data $X^1, X^2$, and so on of a target object of the simulation), executes a collision simulation of the object, and outputs shape data of the object which changes in the collision simulation (for example, shape data $Y^1, Y^2$, and so on in a time series during a collision).

FIG. 2 illustrates an example of the relationship between the difference between a plurality of input parameters input to the system to be analyzed by the analysis device of the present invention and the amount of difference between a plurality of corresponding pieces of output data. In this example, as illustrated in FIG. 2, three pieces of input data $X^m$, where m represents 1 to 3, each include input parameters $x^m_1$ and $x^m_2$ illustrated on the vertical axis and the horizontal axis, respectively. Output data $Y^1$ to $Y^3$ which are distanced from each other by a distance corresponding to the amount of difference between the output data $Y^1$ to $Y^3$ (for example, the Euclidean distance between a plurality of output parameters), correspondingly to the input data $X^1$ to $X^3$, are also illustrated in FIG. 2.

Here, for example, the output data $Y^1$ to $Y^3$ have a relationship in which the distance between the output data $Y^1$ and the output data $Y^2$ is large and the distance between the output data $Y^2$ and the output data $Y^3$ is small. Furthermore, in this example, there is a relationship in which the difference between an input parameter $x^1_1$ of the input data $X^1$ and an input parameter $x^2_1$ of the input data $X^2$ is larger than the difference between an input parameter $x^1_2$ and an input parameter $x^2_2$. Moreover, there is a relationship in which the difference between the input parameter $x^2_1$ of the input data $X^2$ and an input parameter $x^3_1$ of the input data $X^3$ is smaller than the difference between the input parameter $x^2_2$ and an input parameter $x^3_2$.

Here, assuming that the value of output data is varied according to the value of an input parameter, the output data greatly changes when the input parameter greatly changes. In the system illustrated in FIG. 2, there is a relationship in which even in the case where the change in input parameters $x^m_2$ is large, the change (that is, the distance) between output data $Y^m$ is small; however, in the case where the change in input parameters $x^m_1$ is large, the change between the output data $Y^m$ is large. Therefore, it is estimated that output data $Y^m$ is much more affected by input parameters $x^m_1$.

By learning the relationship between the difference between input parameters and the amount of difference of output data from learning data, the analysis device of the present invention generates an estimation model for estimating a change in the output data with respect to changes in input parameters. Thus, in the system, based on the estimation model, the analysis device of the present invention estimates that among a plurality of input parameters, changes in some input parameters (for example, $x^m_1$ in FIG. 2) greatly affect a change in output data $Y^m$, and changes in other input parameters (for example, $x^m_2$ in FIG. 2) does not greatly affect a change in the output data $Y^m$, and also estimates the magnitude of the effect of the input parameters $x^m_1$ to $x^m_2$ on the output data $Y^m$.

Figure 3:
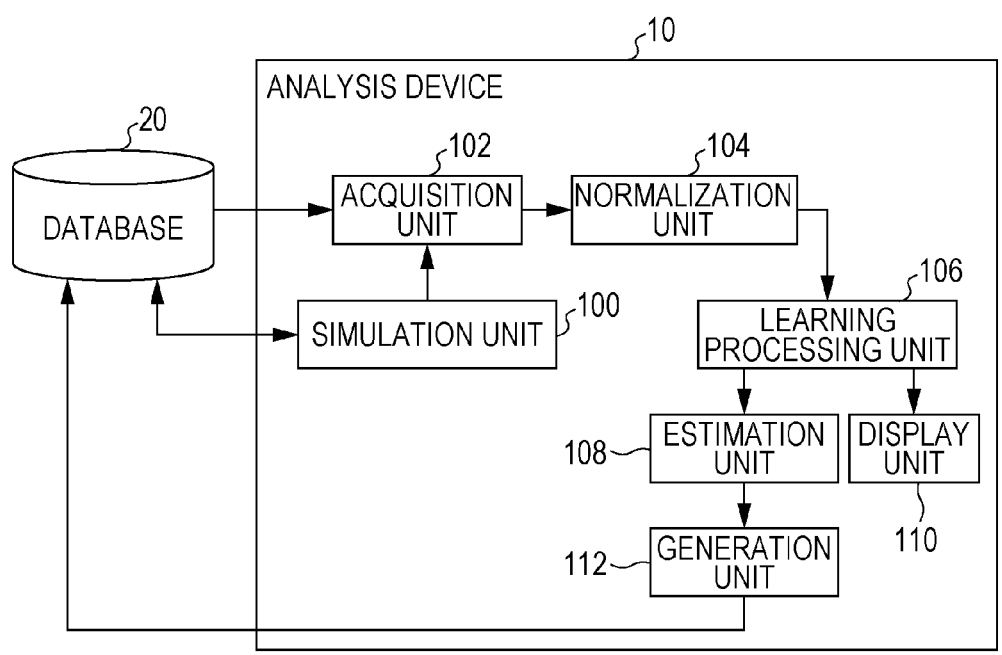
FIG. 3 illustrates a block diagram of the analysis device according to the embodiment.

FIG. 3 illustrates a block diagram of the analysis device 10 according to this embodiment. The analysis device 10 includes a simulation unit 100, an acquisition unit 102, a normalization unit 104, a learning processing unit 106, an estimation unit 108, a display unit 110, and a generation unit 112.

The simulation unit 100 executes a simulation based on a plurality of pieces of input data, and generates an execution result as output data. The simulation unit 100 supplies the output data along with the input data to the acquisition unit 102. The simulation unit 100 may allow the output data to be stored in a database 20.

The acquisition unit 102 acquires learning data which includes a plurality of sets of input data and output data. For example, the acquisition unit 102 acquires learning data which includes a plurality of sets of input data and output data from the simulation unit 100 or the database 20. The acquisition unit 102 supplies the acquired learning data to the normalization unit 104.

The normalization unit 104 normalizes input parameters of a plurality of pieces of input data in the learning data. The normalization unit 104 supplies the learning data which includes the input data including the normalized input parameters to the learning processing unit 106. As an alternative to this configuration, the normalization unit 104 may directly supply the input data to the learning processing unit 106 without normalization.

The learning processing unit 106 learns through regression analysis, based on the learning data acquired from the normalization unit 104, the amount of difference of output data corresponding to a difference between corresponding input parameters of two pieces of input data. Thus, the learning processing unit 106 generates an estimating model for estimating a change in the output data with respect to changes in the input parameters. The learning processing unit 106 supplies the estimation model to the estimation unit 108 and the display unit 110. The specific processing details of the learning processing unit 106 will be described later.

The estimation unit 108 estimates the amount of change in output data with respect to the amount of change in input data, based on the estimation model. For example, the estimation unit 108 estimates, based on the estimation model, the amount of change in output data at the time when a user inputs the amount of change in input data. The estimation unit 108 may estimate the change rate of output data, based on the estimation model. The estimation unit 108 supplies an estimation result, such as the amount of change in output data, to the display unit 110 and the generation unit 112.

The display unit 110 displays the amount of change in output data estimated in accordance with the amount of change in input parameters received from the estimation unit 108. The display unit 110 may display the estimation model generated by the learning processing unit 106.

The generation unit 112 generates new input data based on the estimation result by the estimation unit 108. For example, in the case where the amount of change in target output data is obtainable as a result of estimation of the amount of change in output data by the estimation unit 108, the generation unit 112 generates new input data to obtain the target output data, based on the amount of change in input parameters corresponding to the amount of change in the output data.

As described above, the analysis device 10 obtains the learning data which includes a plurality of sets of input data and output data, and learns the relationship between the difference between corresponding input parameters in a plurality of pieces of input data and the amount of difference in output data. Thus, the analysis device 10 may estimate the pattern of change in output data when input parameters are changed. Furthermore, the analysis device 10 may generate input data to obtain target output data.

Figure 4:
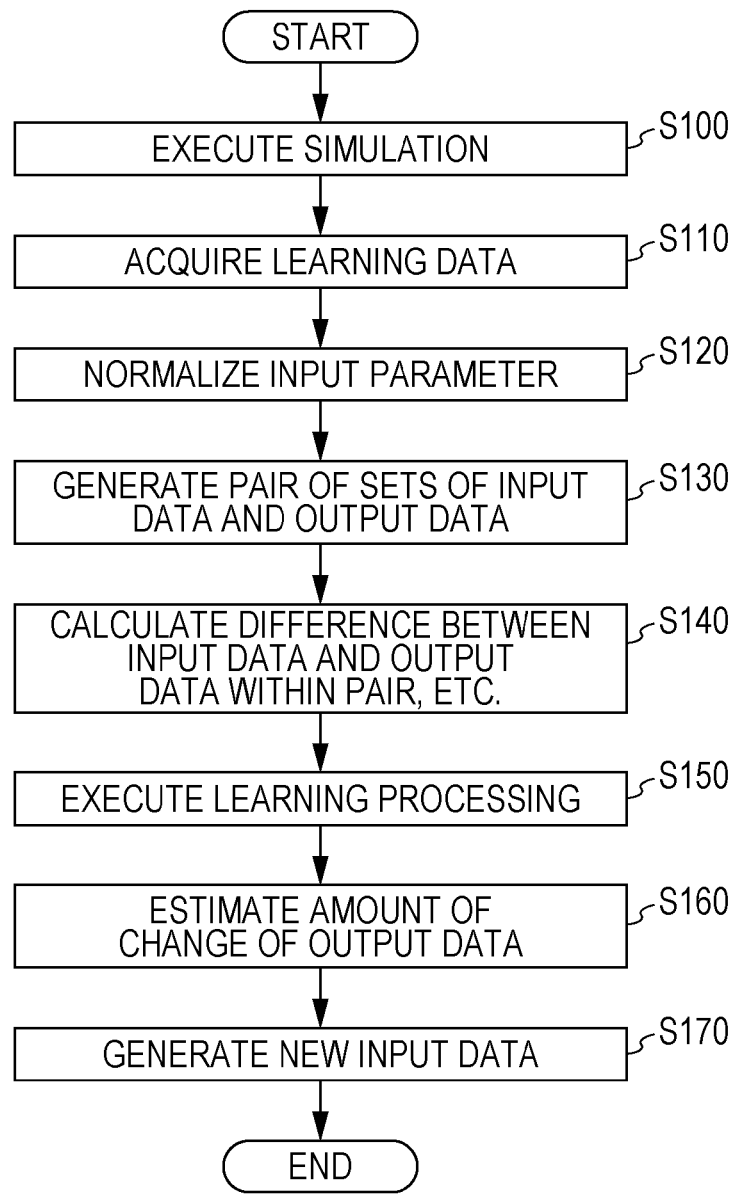
FIG. 4 illustrates a processing flow by the analysis device according to the embodiment.

FIG. 4 illustrates a processing flow by the analysis device 10 according to this embodiment. In this embodiment, the analysis device 10 analyzes the system by performing the processing of S100 to S170.

First, with continued reference to FIGS. 3 and 4, in S100, the simulation unit 100 executes a simulation to generate learning data. For example, the simulation unit 100 obtains a plurality of pieces of input data, such as design data of an object from the database 20, which is separate from the analysis device 10, and executes a collision simulation for simulating deformation of the object by a collision. The simulation unit 100 generates output data which includes time series data or the like of an object shape that is deformed in the collision simulation as each output parameter, and supplies the output data along with the input data to the acquisition unit 102. The simulation unit 100 may store the output data in the database 20.

As an alternative to execution of a collision simulation, the simulation unit 100 may obtain from the database 20, as output data, time series data of an object shape measured in an actual test based on input data, and supply the time series data to the acquisition unit 102.

Next, in S110, the acquisition unit 102 acquires learning data which includes a plurality of sets of input data including a plurality of input parameters and output data including one or a plurality of output parameters from the simulation unit 100 or the database 20, which is the exterior of the analysis device 10. The acquisition unit 102 supplies the acquired learning data to the normalization unit 104.

Next, in S120, the normalization unit 104 normalizes the plurality of pieces of input data included in the learning data. For example, the normalization unit 104 normalizes each of the input parameters included in the plurality of input data so that the average is 0 and the variance is 1. For example, the normalization unit 104 performs normalization so that the average and the variance of the nth input parameters $x^1_n$, $x^2_n$, ..., and $x^M_n$ included in M pieces of input data $X^1$ to $X^M$ are 0 and 1, respectively.

By the normalization processing, the normalization unit 104 can reduce the effect of a difference in scale between the plurality of input parameters, and allow the learning processing unit 106 to appropriately evaluate the effect of changes in the plurality of input parameters on the output data. The normalization unit 104 supplies the learning data which includes the input data including the normalized input parameters and the output data to the learning processing unit 106.

Next, in S130, the learning processing unit 106 generates pairs by selecting two sets each including input data and output data to be paired with each other. For example, the learning processing unit 106 generates, from among a plurality of sets of input data and output data which correspond to each other included in the learning data, a plurality of pairs each including two sets so that the combination of two sets is different from pair to pair (for example, pairs in combination of all sets). For example, in the case where the learning data includes M sets of corresponding input data and output data (set 1 of input data $X^1$ and output data $Y^1$, set 2 of input data $X^2$ and output data $Y^2$, ..., and set M of input data $X^M$ and output data $Y^M$), the learning processing unit 106 may generate 1/2·M(M−1) pairs including a pair of set 1 and set 2, a pair of set 2 and set 3, ..., and a pair of set M−1 and set M.

As an alternative to the above, the learning processing unit 106 may generate only some of all the pairs to be generated from among the sets of input data and output data. For example, the learning processing unit 106 may extract some pairs from among the pairs to be obtained from the combinations of all sets so that the number of sets included in the pairs has variation within a predetermined range.

Next, in S140, the learning processing unit 106 calculates, for each of all the pairs, the difference between corresponding input parameters within the pair and the amount of difference between two pieces of output data within the pair. For example, the learning processing unit 106 may calculate, as the difference between the input parameters, a value calculated according to the difference between the two corresponding input parameters (the absolute value, power, power root, exponent, logarithm, or the like, of the difference between the input parameters). For example, the learning processing unit 106 calculates, for a pair which includes a set of input data $X^m$ and output data $Y^m$ and a set of input data $X^n$ and output data $Y^n$, the amount of difference between the output data $Y^m$ and the output data $Y^n$, by calculating the difference ($|x^m_1-x^n_1|$) between the first input parameter $x^m_1$ of the input data $X^m$ and the first input parameter $x^n_1$ of the corresponding input data $X^n$, the difference ($|x^m_2-x^n_2|$) between the second input parameter $x^m_2$ of the input data $X^m$ and the second input parameter $x^n_2$ of the input data $X^n$, ..., and the difference ($|x^m_D-x^n_D|$) between the Dth input parameter $x^m_D$ of the input data $X^m$ and the Dth input parameter $x^n_D$ of the input data $X^n$.

Furthermore, the learning processing unit 106 may calculate, as the amount of difference between the output data $Y^m$ and the output data $Y^n$, an amount representing the difference in the magnitude between the values of the plurality of output parameters included in the output data $Y^m$ and the output data $Y^n$. For example, the amount of difference between the output data $Y^m$ and the output data $Y^n$ can be calculated by calculating $f(Y^m,Y^n)$ by a predetermined function f for calculating the amount of difference of structured data. For example, the learning processing unit 106 may calculate the distance between the output data as the amount of difference of the output data, by using a distance function input as the function f for calculating the Euclidean distance, dynamic time warping distance, editing distance, Hamming distance and/or the like, between two pieces of data.

Next, in S150, the learning processing unit 106 performs pair-wise regression to perform regression analysis of the relationship between the difference between the input parameters and the amount of difference of the output data for each pair. For example, the learning processing unit 106 learns, for each of the plurality of pairs, the amount of difference between the two pieces of output data within the pair according to the difference between input parameters in the two pieces of input data within the pair. For example, the learning processing unit 106 generates, for each of all the pairs, an estimation model for estimating a change in the output data with respect to a change in the input parameters, by learning, through regression analysis, the distance $f(Y^m, Y^n)$ between the two pieces of output data within the pair with respect to the difference $|x^m_1-x^n_1|$ between the input parameters in the two pieces of input data within the pair.

Specifically, the learning processing unit 106 performs learning processing to approximate the distance $g(X^m,X^n;\theta)$ between two pieces of input data $X^m$ and $X^n$ represented by Equation 1 (below), the distance $g(X^m,X^n;\theta)$ being obtained by weighting the difference $|x^m_i-x^n_i|$ between input parameters of the two pieces of input data $X^m$ and $X^n$ within a pair by the degree $\theta_i$ of change corresponding to the difference between the input parameters, to the distance $f(Y^m,Y^n)$ between the two pieces of output data with respect to the two pieces of input data.

$$g(X^m,X^n;\theta)=\sum_{i=1}^{D}\theta_i|x^m_i-x^n_i| \qquad \text{Equation 1:}$$

As an alternative to the above, the learning processing unit 106 may estimate the amount of difference in the output data for every range of the value between the two input parameters, using the degree of change for every range of value between the two input parameters. Specifically, the learning processing unit 106 calculates a difference $|u(x^m_i-\eta_k)-u(x^n_i-\eta_k)|$ between a step function $u(x^m_i-\eta_k)$ in which a term obtained by subtracting a reference value $\eta_k$ from an input parameter $x^m_i$ of one piece of input data $X^m$ within the pair is defined as an argument, 0 is output when an argument less than 0 is input, and 1 is output when an argument of zero or more is input, and a step function $u(x^n_i-\eta_k)$ in which a term obtained by subtracting the reference value $\eta_k$ from an input parameter $x^n_i$ of the other piece of input data $X^n$ within the pair is defined as an argument, 0 is returned when the argument is less than 0, and 1 is returned when the argument is zero or more. The learning processing unit 106 obtains the distance $g(X^m,X^n;\theta)$ between two pieces of input data represented by Equation 2 (below) by weighting the calculated difference $|u(x^m_i-\eta_k)-u(x^n_i-\eta_k)|$ by the degree $\theta_{i,k}$ of change corresponding to the kth (k∈K, K represents the number of the reference values $\eta_k$) range k of the ith input parameter. The learning processing unit 106 performs learning processing to approximate the calculated distance $g(X^m,X^n;\theta)$ between the two pieces of input data to the distance $f(Y^m, Y^n)$ between the two pieces of output data with respect to the two pieces of input data.

$$g(X^m, X^n; \theta) = \sum_{i=1}^{D} \sum_{k=1}^{K} \theta_{i,k} |u(x_i^m - \eta_k) - u(x_i^n - \eta_k)| \quad \text{Equation 2}$$

Furthermore, as an alternative to the above, the learning processing unit 106 may use the degree of change for every range of the value of a difference between the two input parameters to estimate the amount of difference between the output data for every range of the difference between the input parameters. Specifically, the learning processing unit 106 obtains the distance $g(X^m, X^n; \theta)$ between the two pieces of input data represented by Equation 3 (below) by weighting a step function $u(|x_i^m - x_i^n| - \eta_k)$ in which a term obtained by subtracting the reference value $\eta_k$ from the difference $|x_i^m - x_i^n|$ between the input parameter $x_i^m$ of one piece of input data $X^m$ within the pair and the input parameter $x_i^n$ of the other piece of input data $X^n$ within the pair is defined as an argument, 0 is output when an argument less than 0 is input, and 1 is output when an argument of zero or more is input, by the degree $\theta_{i,k}$ of change corresponding to the kth ($k \in K$, K represents the number of the reference values $\eta_k$) range k of the ith input parameter. The learning processing unit 106 performs learning processing to approximate the distance $g(X^m, X^n; \theta)$ to the distance $f(Y^m, Y^n)$ between the two pieces of output data with respect to the two pieces of input data.

$$g(X^m, X^n; \theta) = \sum_{i=1}^{D} \sum_{k=1}^{K} \theta_{i,k} u(|x_i^m - x_i^n| - \eta_k) \quad \text{Equation 3}$$

The learning processing unit 106 optimizes the degree $\theta_i$ of change or the degree $\theta_{i,k}$ of change, as the distance $f(Y^m, Y^n)$ between the output data is predicted from the distance $g(X^m, X^n; \theta)$ between the input data as represented by Equations 1 to 3. The learning processing unit 106 may perform the optimization of the degree $\theta_i$ of change by known regression analysis methods, such as a least-squares method, a regularized least squares method, and/or a constrained least squares method.

Next, in S160, the estimation unit 108 performs an estimation of the amount of change based on the estimation model, and the display unit 110 displays the estimation result. For example, the estimation unit 108 calculates $g(X^R, X^T; \theta)$ corresponding to the difference between the input parameters using Equation 1 or Equation 3 by inputting the difference between the input parameters from a user and inputting the degree of change optimized by the learning processing unit 106 in the degree $\theta_i$ or $\theta_{i,k}$ ($i \in D$, $k \in K$) of change. The calculated $g(X^R, X^T; \theta)$ may be defined as be the amount of change in the output data corresponding to the difference between the input parameters.

Furthermore, for example, the estimation unit 108 calculates $g(X^R, X^T; \theta)$ using Equation 2 by inputting arbitrary input data $X^R$ which serves as a reference in the input data $X^m$ from the user, inputting input data $X^T$ which serves as a prediction target in the input data $X^n$, and inputting the degree of change optimized by the learning processing unit 106 in the degree $\theta_{i,k}$ ($i \in D$, $k \in K$) of change. The estimation unit 108 may estimate the calculated result as the amount of change from the output data $Y^R$ corresponding to the input data $X^R$ to the output data $Y^T$ corresponding to the input data $X^T$.

The estimation unit 108 may estimate the change rate of output data on the basis of the estimated amount of change. For example, the estimation unit 108 may estimate a value obtained by dividing the amount of change of output data by the difference between input parameters as the change rate of the output data. The display unit 110 may receive and display the amount of change and/or the change rate estimated by the estimation unit 108.

Furthermore, the display unit 110 displays a learning result by the learning processing unit 106. For example, the display unit 110 may display a list, a table, and/or a graph indicating the degree $\theta_i$ of change or the degree $\theta_{i,k}$ of change optimized for each of i and k (or a value of $\eta_k$) as an estimation model generated by the learning processing unit 106. Thus, the display unit 110 displays to the user the state of a change in output data when input parameters are changed.

Next, in S170, the generation unit 112 generates new input data based on the estimation result of the amount of change in the output data obtained in S150. For example, when the amount of change in target output data is obtainable as a result of the estimation of the amount of change in output data based on Equations 1 to 3 by the estimation unit 108, the generation unit 112 generates new input data obtained by adding and/or subtracting the amount of change in input parameters corresponding to the amount of change in the output data to/from input parameters of input data which serves as a reference. The generation unit 112 may include and store the generated new input data in the learning data in the database 20.

As described above, with the analysis device 10, by generating a pair generated from a set of input data and output data to learn the relationship between the difference between input parameters and the amount of difference between the output data within the pair, an estimation model is generated for estimating the amount of change in the output data based on the amount of change in the input parameters.

For example, the analysis device 10 may estimate, using the estimation model based on Equation 1, the ratio of change provided to output data by a change in an input parameter, may estimate, using the estimation model based on Equation 2, the pattern of change and the magnitude of change provided to output data in the case where the input parameter is changed to a different value from the reference value, and may estimate, using the estimation model based on Equation 3, the pattern of change and the magnitude of change provided to output data in the case where an input parameter is changed by a certain magnitude.

Thus, the analysis device 10 is able to predict the degree of change of output data obtained from input data to be predicted from output data which serves as a reference, and display the prediction result to the user. Furthermore, the analysis device 10 may obtain separate new input data to alter output data significantly with respect to input data which serves as a reference. Therefore, the analysis device 10 may verify whether the new input data provides the output data which changes exactly as estimated by re-simulation.

Figure 5:
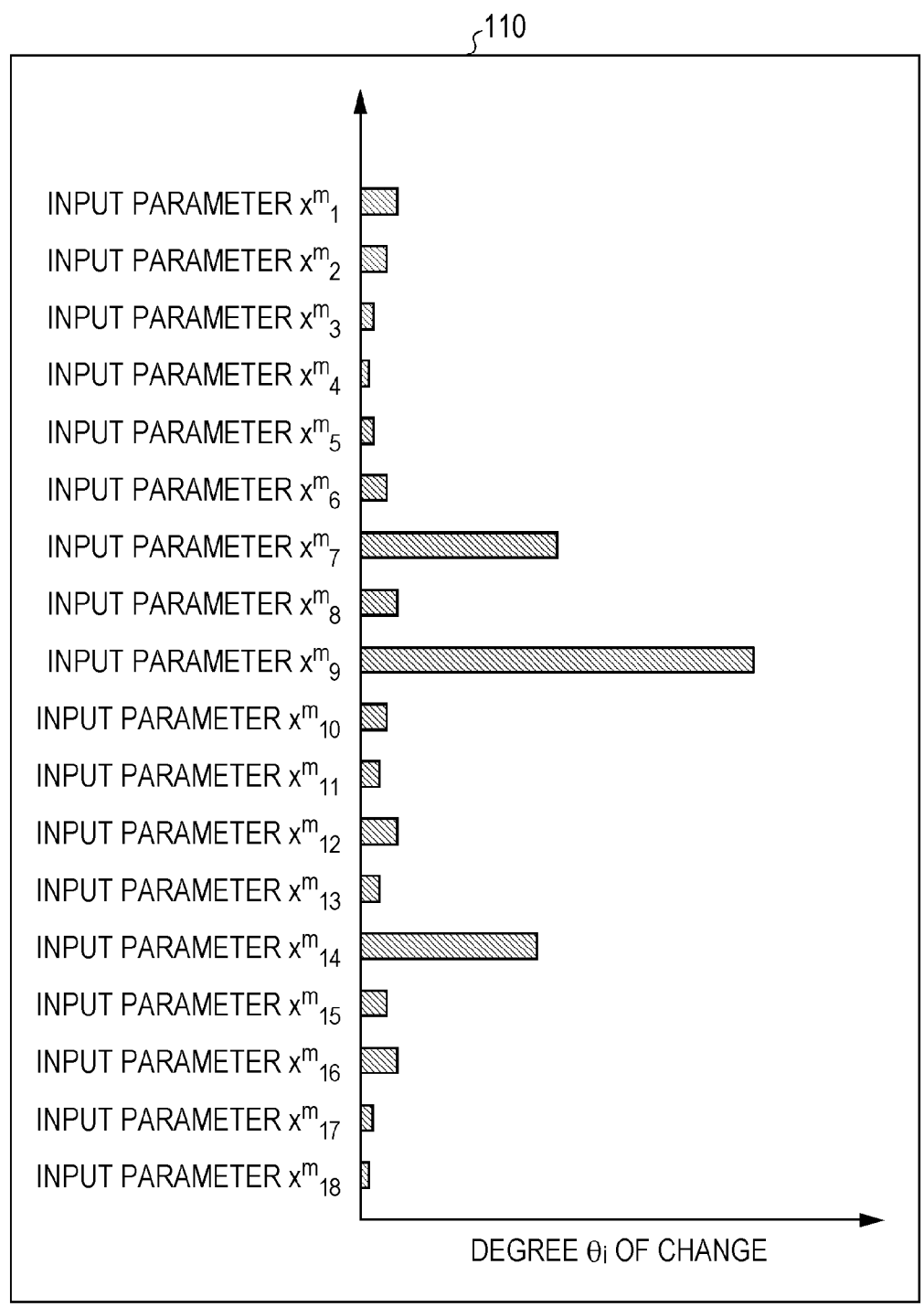
FIG. 5 illustrates the degree $\theta_i$ of change to be optimized based on a first equation by a learning processing unit.

FIG. 5 illustrates an example of the degree $\theta_i$ of change obtained by optimization based on Equation 1 (above) by the learning processing unit 106. This example illustrates a case in which input data $X^m$ (m∈M, M represents an integer which represents the number of pieces of input data) includes 18 input parameters $x_1^m$ to $x_{18}^m$, and the learning processing unit 106 optimizes $\theta_1$ to $\theta_{18}$ for the individual input parameter $x_1^m$ to $x_{18}^m$. The degree $\theta_i$ of change indicates the magnitude of a change in output data $Y^m$ predicted when input parameters $x_i^m$ change. The display unit 110 may display the graph illustrated in FIG. 5 as the estimation model in S160.

As illustrated in FIG. 5, among the input parameters, the input parameter $x_7^m$, the input parameter $x_9^m$, and the input parameter $x^m_{14}$ have relatively large values of the degree $\theta_7$ of change, the degree $\theta_9$ of change, and the degree $\theta_{14}$ of change compared to the other input parameters. Accordingly, in the estimation model, it is estimated that the input parameters $x^m_7$, $x^m_9$, and $x^m_{14}$ greatly affect the output data. Therefore, it is indicated that when it is desired to largely change the output data, the input parameters $x^m_7$, $x^m_9$, and $x^m_{14}$ may be changed with priority. The analysis device of the present invention may predict, based on the degree of change, how much the input parameters should change in order to become close to the target output data, and a simulation by input data modified by the prediction can be re-performed.

Figure 6:
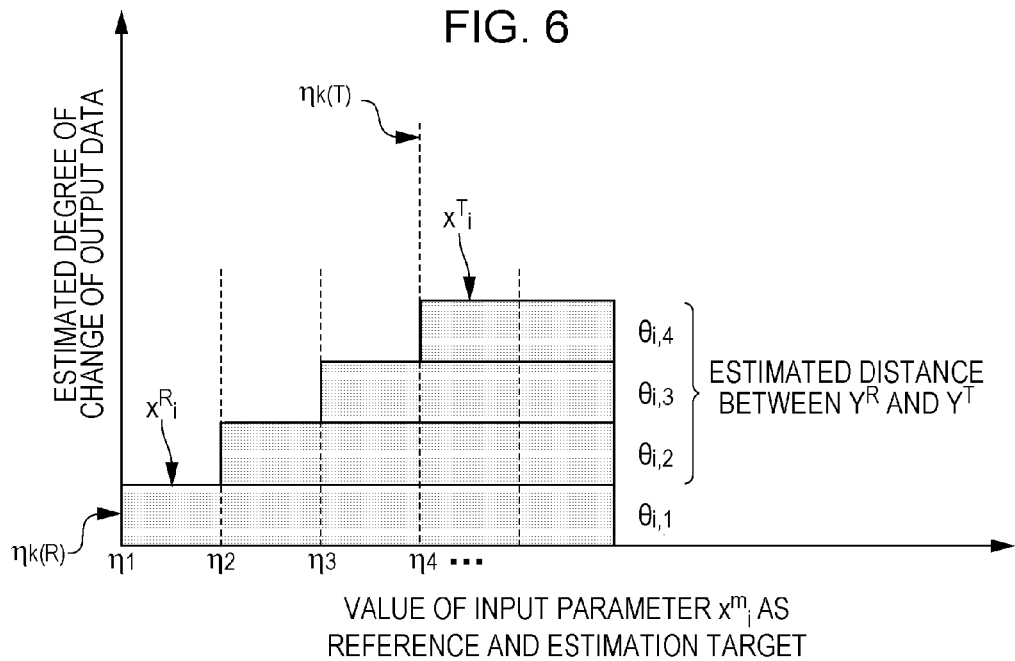
FIG. 6 illustrates the degree $\theta_{i,k}$ of change to be optimized based on a second equation by the learning processing unit.

FIG. 6 illustrates the degree $\theta_{i,k}$ of change to be optimized by the learning processing unit 106 based on Equation 2 (above). In this example, the learning processing unit 106 optimizes $\theta_{i,k}$ with respect to input parameters $x^m_i$ included in the input data $X^m$ and predetermined k reference values $\eta_k$. The reference values $\eta_k$ are constants for appropriately discretizing the value of the input parameters $x^m_i$. For example, the reference values $\eta_k$ may be provided at regular intervals or at different intervals within the range in which the values of all of or the majority of input parameters $x^m_i$ in the learning data exist. The learning processing unit 106 may provide a reference value $\eta_{i,k}$ for every D input parameters.

The estimation unit 108 specifies a reference value $\eta_k(R)$ which includes the value of an input parameter $x^R_i$ of input data $X^R$ which serves as a reference between the reference values $\eta_{k(R)}$ and $\eta_{k(R)+1}$, and a reference value $\eta_{k(T)}$ which includes the value of an input parameter $x^T_i$ of input data $X^T$ which serves as an estimation target between the reference values $\eta_{k(T)}$ and $\eta_{k(T)+1}$. The estimation unit 108 estimates, as the distance between the output data $Y^R$ and the output data $Y^T$, the total sum from $\theta_{i,ks+1}$ to $\theta_{i,kl}$ in the case where the smaller one of k(R) and k(T) is represented by ks and the other one of k(R) and k(T) is represented by kl.

For example, as illustrated in FIG. 6, when the value of an input parameter $x^R_i$ is $\eta_1$ or more and less than $\eta_2$, and the value of an input parameter $x^T_i$ is $\eta_4$ or more and less than $\eta_5$, k(R) is 1, k(T) is 4, ks is 1, and kl is 4. Therefore, the estimation unit 108 estimates the distance of the output data $Y^T$ with respect to the output data $Y^R$ as $\theta_{i,2}+\theta_{i,3}+\theta_{i,4}$, which is the total sum from $\theta_{i,2}$ to $\theta_{i,4}$. Furthermore, for example, when the value of the input parameter $x^R_i$ is $\eta_3$ or more and less than $\eta_4$ and the value of the input parameter $x^T_i$ is $\eta_2$ or more and less than $\eta_3$, the estimation unit 108 estimates the distance of the output data $Y^T$ with respect to the output data $Y^R$ as $\theta_{i,3}$.

Figure 7:
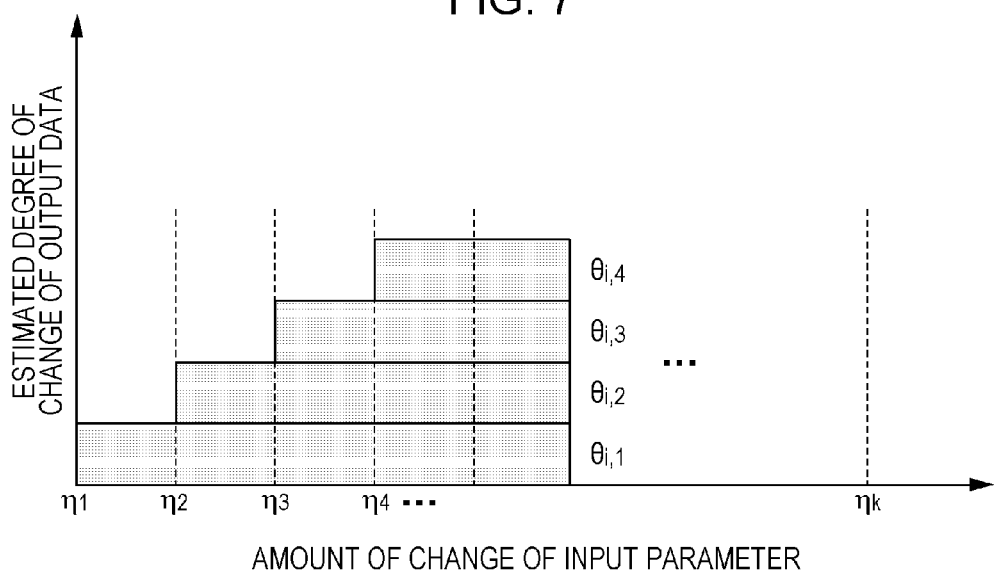
FIG. 7 illustrates the degree $\theta_{i,k}$ of change to be optimized based on a third equation by the learning processing unit.

FIG. 7 illustrates the degree $\theta_{i,k}$ of change to be optimized by the learning processing unit 106 based on Equation 3 (above). In this example, the learning processing unit 106 optimizes $\theta_{i,k}$ with respect to the input parameters $x^m_i$ included in the input data $X^m$ and the predetermined k reference values $\eta_k$. The reference values $\eta_k$ are constants for appropriately discretizing the difference between corresponding input parameters in two pieces of input data. For example, the reference values $\eta_k$ may be provided at regular intervals or at different intervals within a range in which the values of all of or the majority of the difference of the input parameters in the learning data exist. The learning processing unit 106 may provide a reference value $\eta_{i,k}$ for every D input parameters.

The estimation unit 108 specifies a reference value $\eta_k$ which includes the difference value between the input parameter $x^R_i$ of the input data $X^R$ which serves as a reference and the input parameter $x^T_i$ of the input data $X^T$ which serves as an estimation target between the reference values $\eta_k$ and $\eta_{k+1}$, and estimates the total sum from $\theta_{i,1}$ to $\theta_{i,k}$ as the degree of change of the output data $Y^R$ and the output data $Y^T$.

For example, as illustrated in FIG. 7, when the difference value between the input parameter $x^R_i$ and the input parameter $x^T_i$ is $\eta_3$ or more and less than $\eta_4$, the estimation unit 108 estimates that the degree of change of the output data $Y^T$ with respect to the output data $Y^R$ is $\theta_{i,1}+\theta_{i,2}+\theta_{i,3}$. Furthermore, for example, when the value of the input parameter $x^R_i$ is less than $\eta_1$, the estimation unit 108 estimates that the degree of change of the output data $Y^T$ with respect to the output data $Y^R$ is 0.

Figure 8:
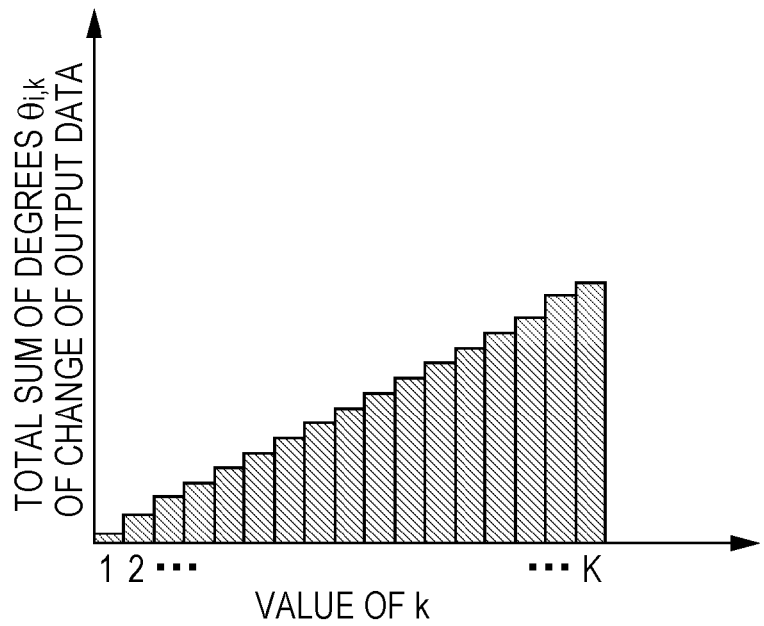
FIG. 8 illustrates an example of the total sum of the optimized degrees $\theta_{i,k}$ of change.

FIG. 8 illustrates an example of the total sum of the degrees $\theta_{i,k}$ of change optimized based on Equation 2 and Equation 3. In FIG. 8, the horizontal axis represents the value of k, and the vertical axis represents the total sum from the degree $\theta_{i,1}$ of change to the degree $\theta_{i,k}$ of change with respect to k. In this example, the total sum of the degrees of change $\theta_{i,k}$ increases substantially uniformly with the value of k, as illustrated in FIG. 8. Thus, when the degree $\theta_{i,k}$ of change is optimized based on Equation 2, the output data $Y^T$ which serves as an estimation target varies linearly from the output data $Y^R$ which serves as a reference, as an input parameter of the corresponding input data $X^T$ varies from the input data $X^R$ which serves as a reference (that is, the value of k increases). Furthermore, when the degree $\theta_{i,k}$ of change is optimized based on Equation 3, the output data Y varies linearly according to the change in an input parameter of the input data X (that is, the value of k).

Figure 9:
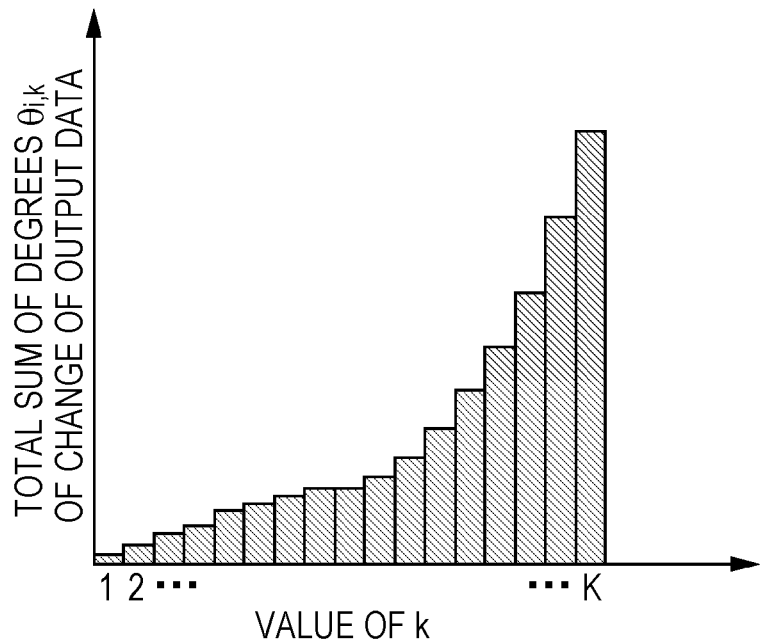
FIG. 9 illustrates an example of the total sum of the optimized degrees $\theta_{i,k}$ of change.

FIG. 9 illustrates another example of the total sum of the degrees $\theta_{i,k}$ of change optimized based on Equation 2 and Equation 3. The horizontal axis and the vertical axis of FIG. 9 are the same as those illustrated in FIG. 8. In this example, the total sum of the degrees $\theta_{i,k}$ of change increases with increasing speed with the value of k, as illustrated in FIG. 9. Thus, when the degree $\theta_{i,k}$ of change is optimized based on Equation 2, the output data $Y^T$ which serves an estimation target will scarcely change when a change in the input parameter of the corresponding input data $X^T$ is small from the input data $X^R$ which serves as a reference (that is, the value of k increases). However, the output data $Y^T$ increases with increasing speed when the input parameter changes significantly. Furthermore, when the degree $\theta_{i,k}$ of change is optimized based on Equation 3, the output data Y will scarcely change while the change in the input parameter of the input data X (the value of k) is small. However, the output data Y increases with increasing speed when a change in the input parameter becomes large.

Figure 10:
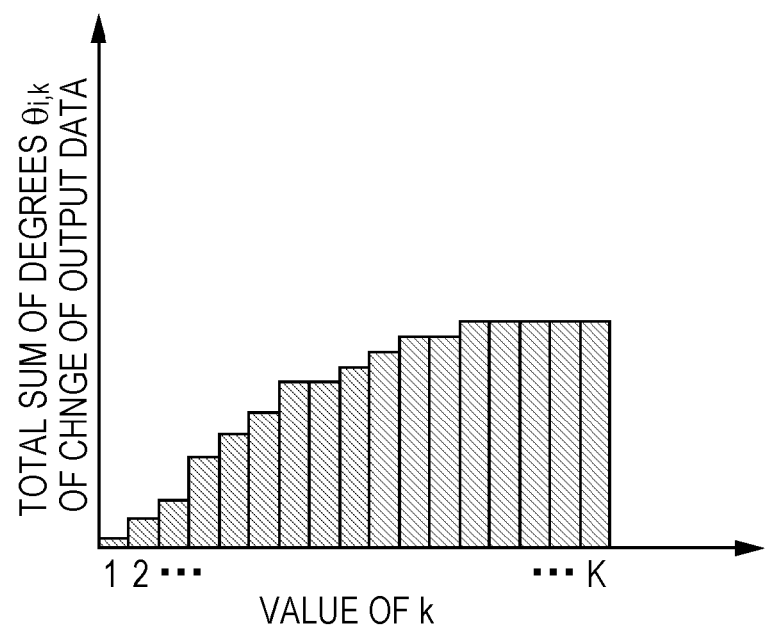
FIG. 10 illustrates an example of the total sum of the optimized degrees $\theta_{i,k}$ of change.

FIG. 10 illustrates another example of the total sum of the degrees $\theta_{i,k}$ of change optimized based on Equation 2 and Equation 3. The horizontal axis and the vertical axis of FIG. 10 are the same as those illustrated in FIG. 8. In this example, the total sum of the degrees $\theta_{i,k}$ of change increases with the value of k but is saturated in the course of increase, as illustrated in FIG. 10. Thus, when the degree $\theta_{i,k}$ of change is optimized based on Equation 2, the output data $Y^T$ which serves as an estimation target varies linearly while the input parameter of the corresponding input data $X^T$ varies by a small amount from the input data $X^R$ which serves as a reference (that is, the value of k increases). However, the change of the output data is saturated as the change in the input parameter becomes large. Furthermore, when the degree $\theta_{i,k}$ of change is optimized based on Equation 3, the output data Y varies linearly while the change in the input parameter of the input data X (the value of k) is small.

However, the output data Y is saturated when the change in the input parameter becomes large.

As described above, with the analysis device 10 according to this embodiment, the pattern of change of the output data according to the change in an input parameter may be represented by the estimation model generated from the learning data. Therefore, the change of the output data may be predicted in more detail.

In the above description, examples of the analysis device of the present invention being executed for the system which executes simulations for a collision simulation or the like have mainly been described. However, the system to be analyzed by the analysis device of the present invention is not limited thereto, and the analysis device of the present invention can be applied to other various structured output problems. For example, the analysis device of the present invention may be applied to a system which inputs and outputs graph structures and a system which inputs and outputs text. In these cases, the learning processing unit of the present invention may use a function input as a function f to calculate the degree of similarity between two graph structures, the editing distance between two pieces of text, or the like.

Figure 11:
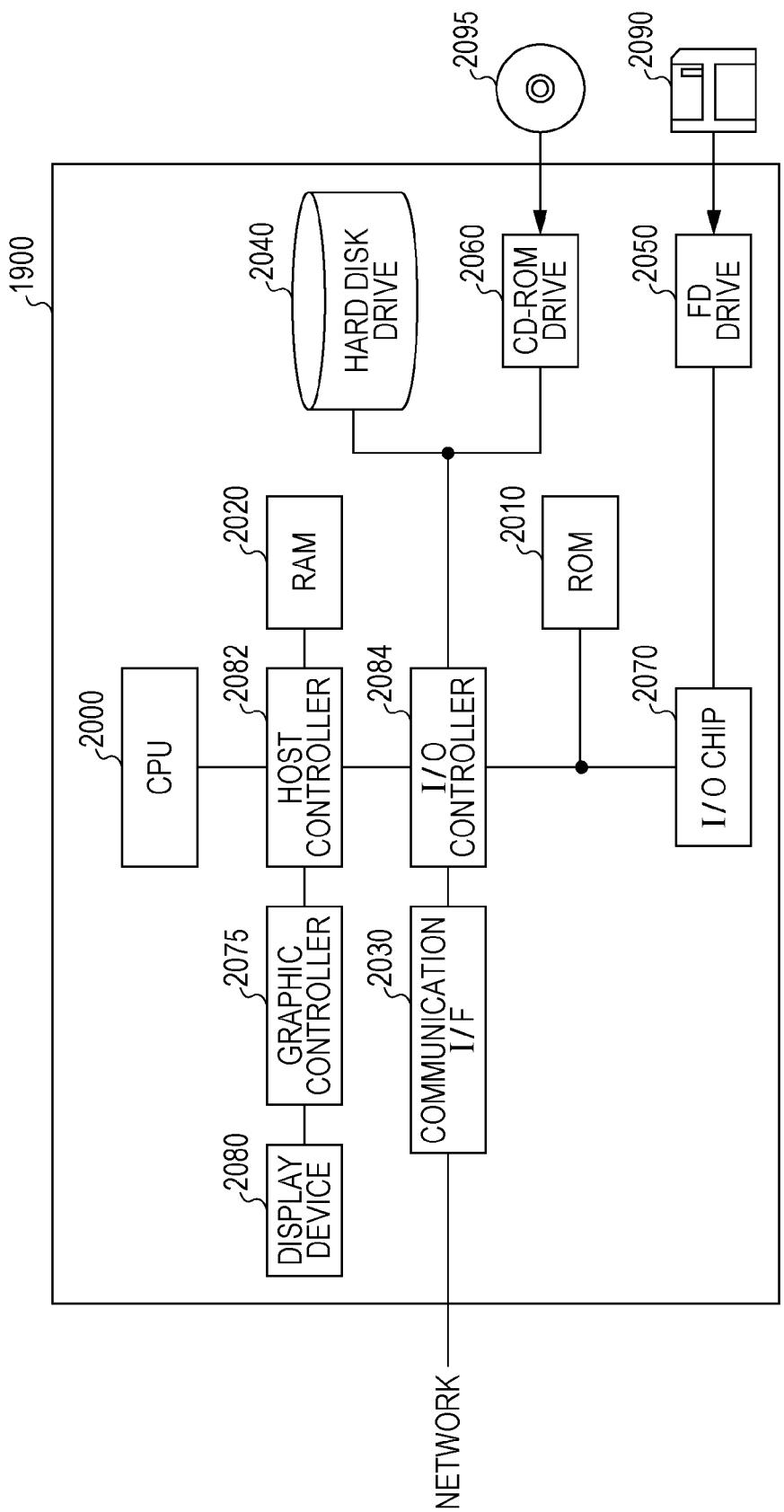
FIG. 11 illustrates an example of a hardware configuration of a computer.

FIG. 11 illustrates an example of a hardware configuration of a computer 1900 functioning as the analysis device 10. The computer 1900 according to this embodiment includes a CPU peripheral unit including a CPU 2000, a RAM 2020, a graphic controller 2075, and a display device 2080 which are connected to one another through a host controller 2082; an input/output unit including a communication interface 2030, a hard disk drive 2040, and a CD-ROM drive 2060 which are connected to the host controller 2082 through an input/output controller 2084; and a legacy input/output unit including a ROM 2010, a flexible disk drive 2050, and an input/output chip 2070 which are connected to the input/output controller 2084.

The host controller 2082 connects the RAM 2020 with the CPU 2000 which accesses the RAM 2020 at a high transfer rate and the graphic controller 2075. The CPU 2000 operates based on a program stored in the ROM 2010 and the RAM 2020, and controls individual units. The graphic controller 2075 acquires image data generated by the CPU 2000 or the like on a frame buffer provided inside the RAM 2020, and displays the image data on the display device 2080. Instead of this configuration, the graphic controller 2075 may include a frame buffer which stores image data generated by the CPU 2000 or the like.

The input/output controller 2084 connect the host controller 2082 with the communication interface 2030, which is a relatively high-speed input/output device, the hard disk drive 2040, and the CD-ROM drive 2060. The communication interface 2030 communicates with a different device via a network in a wired or wireless manner. Furthermore, the communication interface 2030 functions as hardware which performs communication. The hard disk drive 2040 stores a program and data to be used by the CPU 2000 in the computer 1900. The CD-ROM drive 2060 reads a program or data from a CD-ROM 2095, and supplies the read program or data to the hard disk drive 2040 via the RAM 2020.

To the input/output controller 2084, the ROM 2010 and relatively low-speed input/output devices, such as the flexible disk drive 2050 and the input/output chip 2070, are connected. The ROM 2010 stores a boot program to be executed when the computer 1900 is activated, a program which depends on hardware of the computer 1900, and the like. The flexible disk drive 2050 reads a program or data from a flexible disk 2090, and supplies the read program or data to the hard disk drive 2040 via the RAM 2020. The input/output chip 2070 connects the flexible disk drive 2050 to the input/output controller 2084, and connects various input/output devices to the input/output controller 2084 via, for example, a parallel port, a serial port, a keyboard port, a mouse port, and the like.

A program supplied to the hard disk drive 2040 via the RAM 2020 is stored in a recording medium, such as the flexible disk 2090, the CD-ROM 2095, or an IC card, and supplied by a user. The program is read from the recording medium, installed into the hard disk drive 2040 in the computer 1900 via the RAM 2020, and executed by the CPU 2000.

The program which is installed into the computer 1900 and which causes the computer 1900 to function as the analysis device 10 includes an acquisition module, a normalization module, a learning processing module, an estimation module, and a display module. The program or the module may encourage the CPU 2000 or the like to cause the computer 1900 to function as the acquisition unit 102, the normalization unit 104, the learning processing unit 106, the estimation unit 108, and the display unit 110.

When the information processing described in the above program is read into the computer 1900, the information processing functions as the acquisition unit 102, the normalization unit 104, the learning processing unit 106, the estimation unit 108, and the display unit 110, which are specific means in which software and the above-described various hardware resources cooperate. By achieving operation and processing of information corresponding to an intended purpose of the computer 1900 according to this embodiment with the above specific means, a particular analysis device 10 suitable for the intended purpose can be constructed.

For example, in the case where communication is performed between the computer 1900 and an external device or the like, the CPU 2000 executes a communication program loaded onto the RAM 2020, and issues an instruction for communication processing to the communication interface 2030, based on the processing details described in the communication program. The communication interface 2030 reads transmission data stored in a transmission buffer region or the like provided on a storage device, such as the RAM 2020, the hard disk drive 2040, the flexible disk 2090, or the CD-ROM 2095, and transmits the read transmission data to a network or writes reception data received via the network onto a reception buffer region or the like provided on the storage device, under the control of the CPU 2000. As described above, the communication interface 2030 may transfer transmission and reception data to and from the storage device using a DMA (direct memory access) method. Instead of this configuration, the communication interface 2030 may transfer transmission and reception data by causing the CPU 2000 to read data from a storage device or the communication interface 2030 as a transfer source and writing the data to the communication interface 2030 or the storage device as a transfer destination.

Furthermore, the CPU 2000 causes all or necessary parts of a file, a database, or the like stored in an external storage device, such as the hard disk drive 2040, the CD-ROM drive 2060 (the CD-ROM 2095), or the flexible disk drive 2050 (the flexible disk 2090), to be read onto the RAM 2020 via DMA transfer or the like, and performs various types of processing for the data on the RAM 2020. Then, the CPU 2000 writes the processed data back to the external storage device via DMA transfer or the like. In such processing, the RAM 2020 may be regarded as temporarily retaining the contents of the external storage device. Therefore, in this embodiment, the RAM 2020, the external storage device, and the like are collectively referred to as a memory, a storage unit, a storage device, or the like. For example, a storage unit of the analysis device 10 may appropriately store data received from and/or to be supplied to the acquisition unit 102, the normalization unit 104, the learning processing unit 106, the estimation unit 108, and/or the display unit 110. For example, the storage unit may receive learning data before/after normalization of input data from the acquisition unit 102 or the normalization unit 104 and store the received learning data. Furthermore, the storage unit may store the degrees $\theta_i$ and $\theta_{i,k}$ of change, and the like optimized by the learning processing unit 106.

Various types of information of various programs, data, tables, database, and the like in this embodiment are stored on such a storage device and serve as targets of information processing. The CPU 2000 may hold part of the RAM 2020 in a cache memory, and reading and writing may be performed on the cache memory. Also in such a form, the cache memory implements part of the function of the RAM 2020. Therefore, in this embodiment, except for the case where a distinction is made, the cache memory is also included in the RAM 2020, the memory, and/or the storage device.

Furthermore, the CPU 2000 performs various types of processing including various arithmetic operations, processing of information, condition determination, retrieval and replacement of information, and the like, which are directed by an instruction sequence of a program and described in this embodiment, for data read from the RAM 2020, and writes the processed data back to the RAM 2020. For example, in a condition determination, the CPU 2000 determines whether or not various variables illustrated in this embodiment satisfies the condition that the variables be greater than, smaller than, equal to or greater than, smaller than or equal to, equal to another variable or constant, or the like. When the condition is met (or is not met), a branch to a different instruction sequence is provided or a subroutine is called.

Furthermore, the CPU 2000 is able to retrieve information stored in a file, a database, or the like in the storage device. For example, in the case where a plurality of entries in which attribute values of second attributes are associated with corresponding attribute values of first attributes are stored in the storage device, the CPU 2000 retrieves an entry whose attribute value of the first attribute matches a specified condition from among the plurality of entries stored in the storage device, and reads the attribute value of the second attribute stored in the corresponding entry. Thus, the attribute value of the second attribute corresponding to the first attribute that satisfies the specific condition can be obtained.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the embodiments of the present invention have been described above, the technical scope of the present invention is not limited to the scope of the foregoing embodiments. It is obvious to those skilled in the art that various changes and improvements can be made to the foregoing embodiments. It is also apparent from the scope of claims that the embodiments to which such changes or improvements are made can also be included in the technical scope of the present invention.

It should be noted that processes, such as operations, procedures, steps, and stages, performed by a device, a system, a program, and a method illustrated in the scope of claims, description, and diagrams can be performed in any order as long as the order is not particularly indicated by "prior to," "before," or the like and as long as an output from a previous process is not used in a later process. Even if an operation flow in the scope of claims, description, and diagrams is described using a phrase, such as "first" or "next", it does not necessarily mean that the process must be performed in this order

What is claimed is:

1. An analysis device for analyzing a system that inputs input data including a plurality of input parameters and outputs output data, the device comprising:
    an acquisition unit that acquires learning data including a plurality of sets of the input data and the output data; and
    a learning processing unit that learns, based on the acquired learning data, an amount of difference of output data corresponding to a difference between input parameters of two pieces of input data, wherein the learning processing unit generates an estimation model for learning a distance between two pieces of output data with respect to the difference between the input parameters of the two pieces of input data and estimating a change of the output data with respect to a change of the input parameters, and wherein the learning processing unit performs learning processing of approximating a distance obtained by weighting the difference between the input parameters of the two pieces of input data in the learning data by a degree of change corresponding to the difference between the input parameters to a distance between two pieces of output data corresponding to the two pieces of input data.

2. The analysis device according to claim 1, wherein the learning processing unit generates an estimation model for estimating, by using a degree of change for every range of a value between the two input parameters, the amount of difference of the output data for the every range of the value between the input parameters.

3. The analysis device according to claim 1, further comprising:
    an estimation unit that estimates, based on the estimation model, an amount of change of output data with respect to an amount of change of the input data.

4. The analysis device according to claim 1, further comprising:
    a normalization unit that performs, for the plurality of pieces of input data, normalization of the input parameters so that an average of the input parameters is 0 and a variance of the input parameters is 1.

5. The analysis device according to claim 1, further comprising:
    a display unit that displays, in accordance with an amount of change of the input parameters, an estimated amount of change of the output data.

6. The analysis device according to claim 1, wherein the input parameters include an initial condition in a collision simulation, and wherein the output data includes shape data of an object in the collision simulation.

7. An analysis method for analyzing a system that inputs input data including a plurality of input parameters and outputs output data, the method comprising:
    an acquisition step of acquiring learning data including a plurality of sets of the input data and the output data; and
    a learning processing step of learning, based on the acquired learning data, an amount of difference of output data corresponding to a difference between input parameters of two pieces of input data, wherein the learning processing step includes generating an estimation model for learning a distance between two pieces of output data with respect to the difference between the input parameters of the two pieces of input data and estimating a change of the output data with respect to a change of the input parameters is generated, and wherein the learning processing step includes performing learning processing for approximating a distance obtained by weighting the difference between the input parameters of the two pieces of input data in the learning data by a degree of change corresponding to the difference between the input parameters to a distance between two pieces of output data corresponding to the two pieces of input data.

8. The analysis method according to claim 7, wherein the learning processing step includes generating an estimation model for estimating, by using a degree of change for every range of a value between the two input parameters, the amount of difference of the output data for the every range of the value between the input parameters is generated.

9. The analysis method according to claim 7, further comprising:
an estimation step of estimating, based on the estimation model, an amount of change of output data with respect to an amount of change of the input data.

10. The analysis method according to claim 7, further comprising:
a normalization step of performing, for the plurality of pieces of input data, normalization of the input parameters so that an average of the input parameters is 0 and a variance of the input parameters is 1.

11. The analysis method according to claim 7, further comprising:
a display step of displaying, in accordance with an amount of change of the input parameters, an estimated amount of change of the output data.

12. The analysis method according to claim 7, wherein the input parameters include an initial condition in a collision simulation, and wherein the output data includes shape data of an object in the collision simulation.

13. A computer program product for analyzing a system that inputs input data including a plurality of input parameters and outputs output data, the computer program product comprising at least one computer readable non-transitory storage medium having computer readable program instructions thereon for execution by a processor, the computer readable program instructions comprising program instructions for:
acquiring learning data including a plurality of sets of the input data and the output data; and
learning, based on the acquired learning data, an amount of difference of output data corresponding to a difference between input parameters of two pieces of input data, wherein the learning includes generating an estimation model for learning a distance between two pieces of output data with respect to the difference between the input parameters of the two pieces of input data and estimating a change of the output data with respect to a change of the input parameters is generated, and wherein the learning includes performing a learning processing for approximating a distance obtained by weighting the difference between the input parameters of the two pieces of input data in the learning data by a degree of change corresponding to the difference between the input parameters to a distance between two pieces of output data corresponding to the two pieces of input data.

14. The computer program product according to claim 13, wherein the learning includes generating an estimation model for estimating, by using a degree of change for every range of a value between the two input parameters, the amount of difference of the output data for the every range of the value between the input parameters is generated.

15. The computer program product according to claim 13, wherein the computer readable program instructions further comprise program instructions for estimating, based on the estimation model, an amount of change of output data with respect to an amount of change of the input data.

16. The computer program product according to claim 13, wherein the computer readable program instructions further comprise program instructions for performing, for the plurality of pieces of input data, normalization of the input parameters so that an average of the input parameters is 0 and a variance of the input parameters is 1.

17. The computer program product according to claim 13, wherein the computer readable program instructions further comprise program instructions for displaying, in accordance with an amount of change of the input parameters, an estimated amount of change of the output data.

18. The computer program product according to claim 13, wherein the input parameters include an initial condition in a collision simulation, and wherein the output data includes shape data of an object in the collision simulation.

* * * * *